(12) United States Patent
Li et al.

(10) Patent No.: US 8,751,913 B2
(45) Date of Patent: Jun. 10, 2014

(54) SYSTEMS AND METHODS FOR REDUCED POWER MULTI-LAYER DATA DECODING

(75) Inventors: Zongwang Li, San Jose, CA (US); Lei Chen, Santa Clara, CA (US); Chung-Li Wang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 269 days.

(21) Appl. No.: 13/295,160

(22) Filed: Nov. 14, 2011

(65) Prior Publication Data

US 2013/0120169 A1    May 16, 2013

(51) Int. Cl.
*H03M 13/00* (2006.01)

(52) U.S. Cl.
USPC .......................................... 714/786; 714/755

(58) Field of Classification Search
USPC .................................. 714/755, 786
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama et al. | |
| 5,317,472 A | 5/1994 | Schweitzer, III | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,065,149 A | 5/2000 | Yamanaka | |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Guy Lamarre
(74) *Attorney, Agent, or Firm* — Hamilton DeSanctis & Cha

(57) ABSTRACT

Various embodiments of the present invention provide systems and methods for data processing. For example, a data processing system is disclosed that includes a data encoder circuit. The data encoder circuit is operable to apply an encoding algorithm to an input data set in accordance with a multi-layer code structure including a first row and a last row to yield an encoded data set. The last row of the multi-layer code structure represented in the encoded data set conforms to an identity matrix.

20 Claims, 6 Drawing Sheets

(56) References Cited

U.S. PATENT DOCUMENTS

| | | | |
|---|---|---|---|
| 6,097,764 | A | 8/2000 | McCallister et al. |
| 6,145,110 | A | 11/2000 | Khayrallah |
| 6,216,249 | B1 | 4/2001 | Bliss et al. |
| 6,216,251 | B1 | 4/2001 | McGinn |
| 6,229,467 | B1 | 5/2001 | Eklund et al. |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,381,726 | B1 | 4/2002 | Weng |
| 6,438,717 | B1 | 8/2002 | Butler et al. |
| 6,473,878 | B1 | 10/2002 | Wei |
| 6,476,989 | B1 | 11/2002 | Chainer et al. |
| 6,625,775 | B1 | 9/2003 | Kim |
| 6,657,803 | B1 | 12/2003 | Ling et al. |
| 6,671,404 | B1 | 12/2003 | Katawani et al. |
| 6,748,034 | B2 | 6/2004 | Hattori et al. |
| 6,757,862 | B1 | 6/2004 | Marianetti, II |
| 6,785,863 | B2 | 8/2004 | Blankenship et al. |
| 6,788,654 | B1 | 9/2004 | Hashimoto et al. |
| 6,810,502 | B2 | 10/2004 | Eidson |
| 6,980,382 | B2 | 12/2005 | Hirano et al. |
| 6,986,098 | B2 | 1/2006 | Poeppelman et al. |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,073,118 | B2 | 7/2006 | Greeberg et al. |
| 7,093,179 | B2 | 8/2006 | Shea |
| 7,113,356 | B1 | 9/2006 | Wu |
| 7,136,244 | B1 | 11/2006 | Rothbert |
| 7,173,783 | B1 | 2/2007 | McEwen et al. |
| 7,184,486 | B1 | 2/2007 | Wu et al. |
| 7,191,378 | B2 | 3/2007 | Eroz et al. |
| 7,203,015 | B2 | 4/2007 | Sakai et al. |
| 7,203,887 | B2 | 4/2007 | Eroz et al. |
| 7,236,552 | B2 | 6/2007 | Raghaven et al. |
| 7,257,764 | B2 | 8/2007 | Suzuki et al. |
| 7,310,768 | B2 | 12/2007 | Eidson et al. |
| 7,313,750 | B1 | 12/2007 | Feng et al. |
| 7,370,258 | B2 | 5/2008 | Iancu et al. |
| 7,403,752 | B2 | 7/2008 | Raghaven et al. |
| 7,430,256 | B2 | 9/2008 | Zhidkov |
| 7,502,189 | B2 | 3/2009 | Sawaguchi et al. |
| 7,505,537 | B1 | 3/2009 | Sutardja |
| 7,509,927 | B2 | 3/2009 | Mukomilow |
| 7,523,375 | B2 | 4/2009 | Spencer |
| 7,587,657 | B2 | 9/2009 | Haratsch |
| 7,590,168 | B2 | 9/2009 | Raghaven et al. |
| 7,702,989 | B2 | 4/2010 | Graef et al. |
| 7,712,008 | B2 | 5/2010 | Song et al. |
| 7,738,201 | B2 | 6/2010 | Jin et al. |
| 7,752,523 | B1 | 7/2010 | Chaichanavong |
| 7,801,200 | B2 | 9/2010 | Tan |
| 7,802,163 | B2 | 9/2010 | Tan |
| 2003/0063405 | A1 | 4/2003 | Jin et al. |
| 2003/0081693 | A1 | 5/2003 | Raghaven et al. |
| 2003/0087634 | A1 | 5/2003 | Raghaven et al. |
| 2003/0112896 | A1 | 6/2003 | Raghaven et al. |
| 2003/0134607 | A1 | 7/2003 | Raghaven et al. |
| 2004/0071206 | A1 | 4/2004 | Takatsu |
| 2004/0098659 | A1 | 5/2004 | Bjerke et al. |
| 2005/0010855 | A1 | 1/2005 | Lusky |
| 2005/0078399 | A1 | 4/2005 | Fung |
| 2005/0111540 | A1 | 5/2005 | Modrie et al. |
| 2005/0157780 | A1 | 7/2005 | Werner et al. |
| 2005/0195749 | A1 | 9/2005 | Elmasry et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0123285 | A1 | 6/2006 | De Araujo et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0210002 | A1 | 9/2006 | Yang et al. |
| 2006/0248435 | A1 | 11/2006 | Haratsch |
| 2006/0256670 | A1 | 11/2006 | Park et al. |
| 2007/0011569 | A1 | 1/2007 | Vila Casado et al. |
| 2007/0047121 | A1 | 3/2007 | Elefeheriou et al. |
| 2007/0047635 | A1 | 3/2007 | Stojanovic et al. |
| 2007/0110200 | A1 | 5/2007 | Mergen et al. |
| 2007/0230407 | A1 | 10/2007 | Petrie et al. |
| 2007/0286270 | A1 | 12/2007 | Huang et al. |
| 2008/0049825 | A1 | 2/2008 | Chen et al. |
| 2008/0055122 | A1 | 3/2008 | Tan |
| 2008/0065970 | A1 | 3/2008 | Tan |
| 2008/0069373 | A1 | 3/2008 | Jiang et al. |
| 2008/0168330 | A1 | 7/2008 | Graef et al. |
| 2008/0276156 | A1 | 11/2008 | Gunnam |
| 2008/0301521 | A1 | 12/2008 | Gunnam |
| 2009/0092174 | A1* | 4/2009 | Wang .................. 375/132 |
| 2009/0185643 | A1 | 7/2009 | Fitzpatrick |
| 2009/0199071 | A1 | 8/2009 | Graef |
| 2009/0235116 | A1 | 9/2009 | Tan et al. |
| 2009/0235146 | A1 | 9/2009 | Tan et al. |
| 2009/0259915 | A1 | 10/2009 | Livshitz et al. |
| 2009/0273492 | A1 | 11/2009 | Yang et al. |
| 2009/0274247 | A1 | 11/2009 | Galbraith et al. |
| 2010/0002795 | A1 | 1/2010 | Raghaven et al. |
| 2010/0042877 | A1 | 2/2010 | Tan |
| 2010/0042890 | A1 | 2/2010 | Gunam |
| 2010/0050043 | A1 | 2/2010 | Savin |
| 2010/0061492 | A1 | 3/2010 | Noeldner |
| 2010/0070837 | A1 | 3/2010 | Xu et al. |
| 2010/0164764 | A1 | 7/2010 | Nayak |
| 2010/0185914 | A1 | 7/2010 | Tan et al. |
| 2011/0075569 | A1 | 3/2011 | Marrow et al. |
| 2011/0080211 | A1 | 4/2011 | Yang et al. |
| 2011/0167246 | A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed 90/21/2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.

(56) References Cited

OTHER PUBLICATIONS

U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding" [online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System Architectures: Synergies with Solid-State Disks" Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matrix Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, March 7.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR REDUCED POWER MULTI-LAYER DATA DECODING

BACKGROUND OF THE INVENTION

The present inventions are related to systems and methods for data processing, and more particularly to systems and methods for data decoding.

Various storage systems include data processing circuitry implemented with a data decoding circuit. In some cases, the data decoding circuit operates on a very large codeword that includes a number of parity bits. This decoding process typically stores an entire codeword including parity bits. Such storage demands large storage circuits which consume both semiconductor area and power. The problem is further exacerbated where non-binary decoding is performed where each symbol has a number of possible values that are each associated with respective probability values.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data processing systems that include a data encoder circuit. The data encoder circuit is operable to apply an encoding algorithm to an input data set in accordance with a multi-layer code structure including a first row and a last row to yield an encoded data set. The last row of the multi-layer code structure represented in the encoded data set conforms to an identity matrix. Some instances of the aforementioned embodiments, include a data processing circuit operable to decode the encoded data set to yield the input data set.

In various instances of the aforementioned embodiments, the data processing circuit includes a data detector circuit and a data decoder circuit. The data detector circuit is operable to apply a data detection algorithm to the encoded data set to yield a detected output. The data decoder circuit is operable to apply a data decode algorithm to a decoder input derived form the detected output to yield a decoded output. The data decoder circuit is operable to: add a second decoded output from the decoder input to yield a first summed output; shift the summed output to conform with the identity matrix to yield a shifted output; and subtract a third decoded output from the shifted output to yield a second summed output. In some such cases, both the second decoded output and the third decoded output are generated based upon the decoder input. The second decoded output is generated on a first application of the data decode algorithm and the third decoded output is generated on a second application of the data decode algorithm, and the first application of the data decode algorithm precedes the second application of the data decode algorithm. In various cases, the first summed output is provided unshifted as an output codeword. In particular cases, the first summed output conforms with the identity matrix prior to shifting.

In some instances of the aforementioned embodiments, the data processing system is implemented as part of a storage device. In other instances of the aforementioned embodiments, the data processing system is implemented as part of a transceiver device. In various instances of the aforementioned embodiments, at least a portion of the data processing system is implemented as part of an integrated circuit. In some instances of the aforementioned embodiments, the encoding algorithm is a low density parity check algorithm. In some cases, the encoding algorithm is a non-binary low density parity check algorithm, and in other cases the encoding algorithm is a binary low density parity check algorithm.

Other embodiments of the present invention provide methods for data processing that include: applying an encoding algorithm by a data encoder circuit to an input data set in accordance with a multi-layer code structure including a first row and a last row to yield an encoded data set. The last row of the multi-layer code structure represented in the encoded data set conforms to an identity matrix. In some cases, the method further includes: applying a data detection algorithm to the encoded data set to yield a detected output; and applying a data decode algorithm to a decoder input derived form the detected output to yield a decoded output. In some such cases, applying the data decode algorithm includes: adding a second decoded output from the decoder input to yield a first summed output; shifting the summed output to conform with the identity matrix to yield a shifted output; and subtracting a third decoded output from the shifted output to yield a second summed output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data decoding.

Various embodiments of the present invention provide systems and methods for data processing. Such systems and methods rely on compressing a decoded output destined for use in subsequent iterations of a data decoding circuit. Prior to using the compressed decoded output, it is decompressed. Such compression and decompression dramatically reduce the amount of internal memory that must be devoted to the data decoding circuit.

Figure 1:
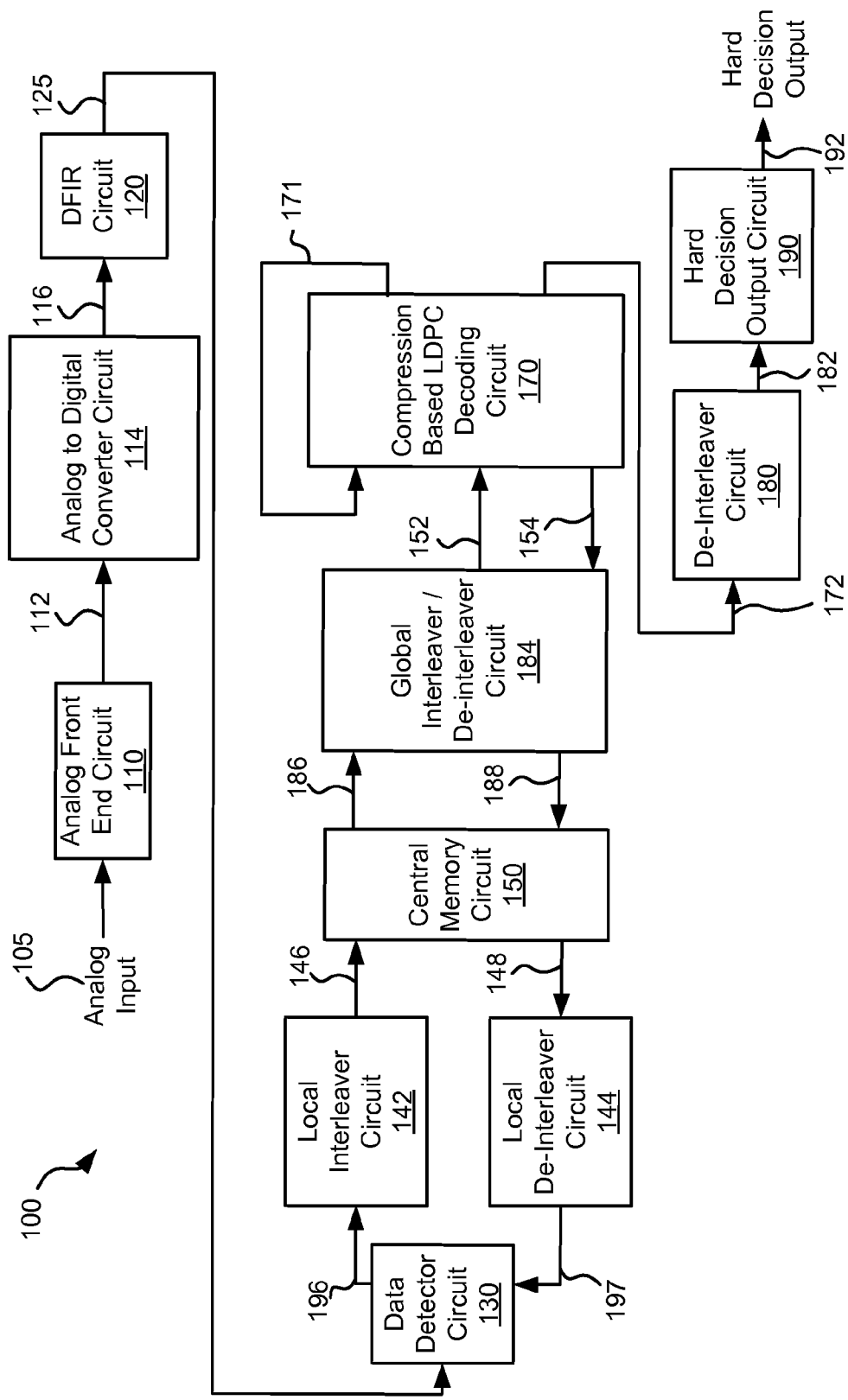
FIG. 1 shows a data processing circuit including a compression based decoding circuit in accordance with one or more embodiments of the present invention.

Turning to FIG. 1, a data processing circuit 100 is shown that includes a compression based data decoding circuit 170 that is operable to decode received codewords using a memory efficient approach in accordance with one or more embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer 120 includes sufficient memory to maintain one or more codewords until a data detector circuit 130 is available for processing. It may be possible that equalized output 125 may be received directly from a storage device in, for example, a solid state storage system. In such cases, analog front end circuit 110, analog to digital converter circuit 114 and equalizer circuit 120 may be eliminated where the data is received as a digital data input.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150.

Once compression based data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 into compression based decoder circuit 170. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Compression based data decoding circuit 170 may be implemented similar to that described below in relation to FIG. 2 or FIG. 8. Compression based data decoding circuit 170 applies a data decode algorithm to decoder input 152 each time yielding a decoded output 171. Compression based data decoding circuit 170 re-applies the data decode algorithm to decoder input 152 guided by decoded output 171.

Where decoded output 171 fails to converge (i.e., fails to yield the originally written data set) and a number of local iterations through compression based decoder circuit 170 exceeds a threshold, the resulting decoded output is provided as a decoded output 154 back to central memory circuit 150 where it is stored awaiting another global iteration through data detector circuit 130 and compression based data decoding circuit 170. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Alternatively, where the decoded output converges (i.e., yields the originally written data set), the resulting decoded output is provided as an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Figure 2:
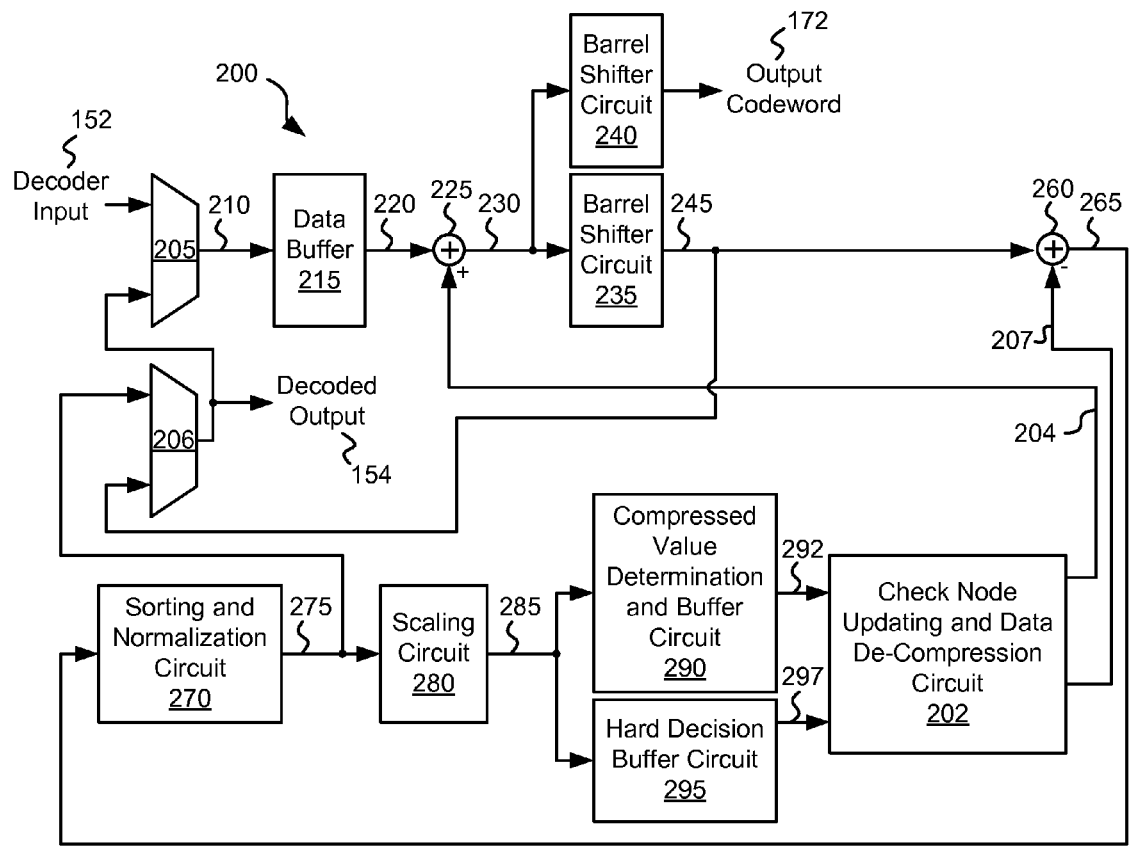
FIG. 2 depicts a compression based decoding circuit in accordance with various embodiments of the present invention.

Turning to FIG. 2, a compression based decoding circuit 200 is shown in accordance with various embodiments of the present invention. Compression based decoding circuit 200 may be used in place of compression based decoding circuit 170 of FIG. 1. Compression based decoding circuit 200 includes a multiplexer 205 that receives decoder input 152. Decoder input 152 is an uncompressed data set. Multiplexer 205 selects between decoder input 152 and decoded output 154 (another uncompressed data set) to be provided as a data input 210. Data input 210 is stored to a data buffer 215. In operation, decoder input 152 is selected as data input 210 before the first local iteration through the data decoder circuit. For later iterations, decoded output 154 is selected by multiplexer 205 as data input 210. As data input 210 is either decoder input 152 and decoded output 154, data input 210 is also uncompressed. Data buffer 215 provides a buffered output 220 to a summation circuit 225.

Summation circuit 225 adds a current de-compressed decoded output 204 to buffered output 220 to yield a summed output 230. Summed output is an uncompressed data set. Summed output 230 is provided to a barrel shifter circuit 240 and to a barrel shifter circuit 235. Barrel shifter circuit 240 is a shift register that is operable to shift summed output 230 to align summed output 230 to be output as output codeword 172. Output codeword 172 is an uncompressed output. Barrel shifter circuit 235 is a shift register that is operable to shift summed output 230 so that it aligns with a previous de-compressed decoded output 207. Barrel shifter 235 provides the aligned output as a shifted output 245 to a summation circuit 260 that is operable to subtract previous decompressed decoded output 207 from shifted output 245 to yield a summed output 265. Summed output 265 is an uncompressed output.

Summed output 265 is provided to a sorting and normalization circuit 270 that sorts elements of summed output 265 and normalizes summed output 265 to yield a decoded output 275. Decoded output 275 is uncompressed. Decoded output 275 and shifted output 245 are provided to a multiplexer circuit 206. Multiplexer circuit 206 selects one of decoded output 275 or shifted output 245 as decoded output 154.

Decoded output 275 is provided to a scaling circuit 280 that is operable to scale decoded output 275 to yield a scaled, decoded output 285. Scaled, decoded output 285 is provided to a compressed value determination circuit 290 and a hard decision buffer circuit 295. Compressed value determination circuit 290 is operable to compress the received data and to buffer the compressed data. Such compression substantially reduces the size of the buffer required to store the data in preparation for subsequent iterations through the data decoder circuit. Hard decision buffer circuit 295 preserves the most likely hard decision for each symbol of scaled, decoded output 285 for use in subsequent decompression. Compressed value determination circuit 290 provides a compressed output 292 to a check node updating and data decompression circuit 202, and sign data buffer circuit 295 provides a hard decision output 297 to check node updating and data de-compression circuit 202. Check node updating and data de-compression circuit 202 performs a check node process and decompresses the result to yield current de-compressed decoded output 204 and previous de-compressed decoded output 207.

In one particular embodiment of the present invention, compression based decoding circuit 200 is a two bit, non-binary decoder circuit where each symbol in decoder input 152 is a two bit symbol representing four possible hard decision values (i.e., '00', '01', '10' and '11'). In such an embodiment, decoder input 152, decoded output 154 and output codeword 172 are vectors of log likelihood ratio (LLR) data corresponding to probabilities that respective ones of the four hard decision values are correct. Summation circuit 225 and summation circuit 260 in such an embodiment are vector summation circuits operable to sum corresponding elements of two vectors to yield a single vector output. Summation circuit 225 receives buffered output 220 that includes a vector of LLR data corresponding to the respective hard decision values of a series of symbols, and adds current de-compressed decoded output 204 that also includes a vector of LLR data corresponding to the respective hard decision values of a series of symbols to yield summed output 230. As is expected, summed output 230 also includes a vector of LLR data corresponding to the respective hard decision values of a series of symbols.

The code structure of the codeword provided as decoder input 152 has a code structure matrix of the following form:

$$\begin{bmatrix} P_{1,1} & P_{1,2} & \ldots & P_{1,J} & \ldots & P_{1,L} \\ P_{2,1} & P_{2,2} & \ldots & P_{2,J} & \ldots & P_{2,L} \\ P_{3,1} & P_{3,2} & \ldots & P_{3,J} & \ldots & P_{3,L} \end{bmatrix}$$

where each of $P_{I,J}$ are pxp circulants with weight 1, and the circulant size L is the row weight. The following is an example of a pxp circulant representative of $P_{I,J}$:

$$P_{I,J} = \begin{bmatrix} 0 & \alpha & 0 & \ldots & 0 \\ 0 & 0 & \alpha & \ldots & 0 \\ \vdots & \vdots & \vdots & \ddots & \vdots \\ 0 & 0 & 0 & \ldots & \alpha \\ \alpha & 0 & 0 & \ldots & 0 \end{bmatrix}$$

In such a two-bit, non-binary decoder circuit, barrel shifter circuit 235 is operable to shift the currently received circulant to an identity matrix. Such an identity matrix may be as follows:

$$P_{I,J} = \begin{bmatrix} \alpha & 0 & 0 & \cdots & 0 \\ 0 & \alpha & 0 & \cdots & 0 \\ \vdots & \vdots & \vdots & \ddots & \vdots \\ 0 & 0 & \alpha & \cdots & 0 \\ 0 & 0 & 0 & \cdots & \alpha \end{bmatrix}$$

Barrel shifter circuit 240 provides a similar shifting to assure that the final data provided as output codeword 172 is aligned as the identity matrix.

Barrel shifter circuit 235 provides shifted output 245 to summation circuit 260. Summation circuit 260 receives shifted output 245 that includes a vector of LLR data corresponding to the respective hard decision values of a series of symbols, and subtracts previous decompressed decoded output 207 that also includes a vector of LLR data corresponding to the respective hard decision values of a series of symbols to yield summed output 265. As is expected, summed output 265 also includes a vector of LLR data corresponding to the respective hard decision values of a series of symbols.

Summed output 265 is provided to sorting and normalization circuit 270. Sorting and normalization circuit 270 takes the four LLR data values from each symbol received as summed output 265, identifies the highest LLR data value of the four values, and normalizes the four LLR data values to the value of the highest LLR data value. An example of the operation of sorting and normalization circuit 270 is shown using the following example symbol:

|  | Hard Decision | | | |
| --- | --- | --- | --- | --- |
|  | 00 | 01 | 10 | 11 |
| LLR Data Value | 10 | 15 | 22 | 6 |

In this example, sorting and normalization circuit 270 selects the LLR data value '22' corresponding to the hard decision '10'. Next, the LLR data values corresponding to hard decision values '00', '01', '10' and '11' are normalized to LLR data value '22' by subtracting '22' from each of the LLR data values to yield the following normalized symbol:

|  | Hard Decision | | | |
| --- | --- | --- | --- | --- |
|  | 00 | 01 | 10 | 11 |
| Normalized LLR Data Value | −12 | −7 | 0 | −16 |

Each of the normalized symbol values are provided as decoded output 275 to scaling circuit 280. Scaling circuit 280 multiplies each of the normalized LLR data values by a scaling factor to yield scaled, decoded output 285. The scaling factor may be user programmable. As an example, the scaling factor is 0.5. Where the scaling factor is 0.5, the following scaled symbol is used:

|  | Hard Decision | | | |
| --- | --- | --- | --- | --- |
|  | 00 | 01 | 10 | 11 |
| Normalized LLR Data Value | −6 | −4 | 0 | −8 |

Scaled, decoded output 285 is provided to compressed value determination and buffer circuit. Compressed value determination and buffer circuit 290 is operable to identify the first minimum LLR data value (i.e., the lowest LLR value) across an entire row of the code structure matrix, and the second minimum LLR data value (i.e., the second lowest LLR value). In addition, compressed value determination and buffer circuit 290 stores the index value (i.e., the location in the row corresponding to the first minimum LLR data value). As the code structure matrix has three rows, compressed value determination and buffer circuit 290 stores three sets of first minimum LLR data value, second minimum LLR data value, index value as shown in the example below:

| Row 1 | First Minimum LLR Value |
|  | Second Minimum LLR Value |
|  | Index Value |
| Row 2 | First Minimum LLR Value |
|  | Second Minimum LLR Value |
|  | Index Value |
| Row 3 | First Minimum LLR Value |
|  | Second Minimum LLR Value |
|  | Index Value |

This compressed form of the data corresponding to the code structure matrix is stored in a buffer that is part of compressed value determination and buffer circuit 290. Compressed value determination and buffer circuit 290 stores a set of data based upon the most recent scaled, decoded output 285.

Scaled, decoded output 285 is also provided to hard decision buffer circuit 295. Hard decision buffer circuit 295 stores the hard decision value for each symbol in a given row corresponding to the highest LLR value. Thus, using the following vector for a symbol of scaled, decoded output 285:

|  | Hard Decision | | | |
| --- | --- | --- | --- | --- |
|  | 00 | 01 | 10 | 11 |
| Normalized LLR Data Value | −6 | −4 | 0 | −8 | hard decision buffer circuit 295 stores the hard decision value '10'. Hard decision buffer circuit 295 stores a set of data based upon the most recent scaled, decoded output 285.

The stored hard decision values from hard decision buffer circuit 295 are provided as a hard decision output 297 to check node updating and data de-compression circuit 202, and the previous set of data from compressed value determination and buffer circuit 290 are provided as compressed output 292 to check node updating and data de-compression circuit 202. Check node updating and data decompression circuit 202 reassembles rows to yield an approximation of the original data. In particular, an approximation of the original data of the last finished layer is provided as an updated decompressed decoded output 204, and an approximation of the original data of the current processing layer is provided as an outdated decoded output 207.

Figure 3:
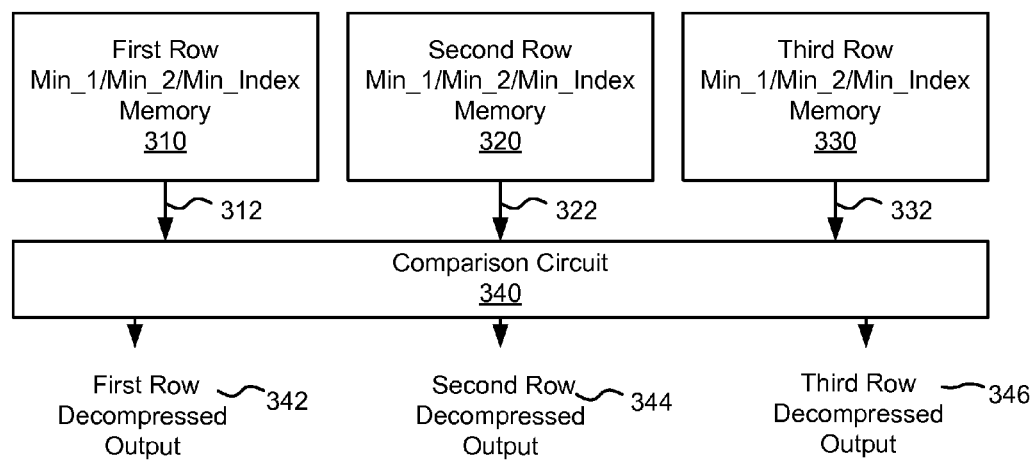
FIG. 3 shows a decompression circuit that may be used in relation to one or more embodiments of the present invention.

FIG. 3 shows a decompression circuit 300 that may be used to perform the decompression of check node updating and data de-compression circuit 290. Decompression circuit 300 includes a first row memory 310 that stores a set of first minimum LLR data value (Min11), second minimum LLR data value (Min12), index value (index1), and hard decision values received from compressed value determination and buffer circuit 290 and hard decision buffer circuit 295. Similarly, decompression circuit 300 includes a second row memory 320 that stores a current and previous set of first minimum LLR data value (Min21), second minimum LLR data value (Min22), index value (index2), and hard decision values received from compressed value determination and buffer circuit 290 and hard decision buffer circuit 295, and decompression circuit 300 includes a third row memory 330 that stores a current and previous set of first minimum LLR data value (Min31), second minimum LLR data value (Min32), index value (index3), and hard decision values received from compressed value determination and buffer circuit 290 and hard decision buffer circuit 295. The data is provided from first row memory 310 to a comparison circuit 340 as an output 312, the data is provided from second row memory 320 to comparison circuit 340 as an output 322, and the data is provided from third row memory 330 to comparison circuit 340 as an output 332. Comparison circuit 340 determines the elements of the reconstructed approximate values. In particular, comparison circuit 340 provides data for the first row as a first row de-compressed output 342, data for the second row as a second row de-compressed output 344, data for the second row as a third row de-compressed output 346.

In operation, the data is received by comparison circuit 340 one symbol from each row at a time (i.e., three symbols at a time). The index value (CI) for the currently received symbol of output 312, output 322 and output 332 is compared with the index values corresponding to the first minimum LLR data value for row one (index 1), the first minimum LLR data value for row two (index2), and the first minimum LLR data value for row three (index3) to yield the comparison values: comparison row 1 (CR1), comparison row 2 (CR2) and comparison row 3 (CR3) in accordance with the following pseudocode:

```
If (CI == index1)
{
    CR1 = 1
}
Else
{
    CR1=0
}
If (CI == index2)
{
    CR2 = 1
}
Else
{
    CR2=0
}
If (CI == index3)
{
    CR3 = 1
}
Else
{
    CR3=0
}
```

These index values are then used to determine the values of first row de-compressed output 342 (CO1), second row de-compressed output 344 (CO2), and third row de-compressed output 346 (CO3) in accordance with the following table:

| CR1, CR2, CR3 | CO1 | CO2 | CO3 |
|---|---|---|---|
| 0, 0, 0 | If (Min11<Min21+Min31){ CO1=Min11} Else { CO1=Min21+Min31} | If (Min21<Min11+Min31){ CO2=Min21} Else { CO2=Min11+Min31} | If (Min31<Min11+Min21){ CO3=Min31} Else { CO3=Min11+Min21} |
| 0, 0, 1 | If (Min11<Min21+Min32){ CO1=Min11} Else { CO1=Min21+Min32} | If (Min21<Min11+Min32){ CO2=Min21} Else { CO2=Min11+Min32} | If (Min32<Min11+Min21){ CO3=Min32} Else { CO3=Min11+Min21} |
| 0, 1, 0 | If (Min11<Min22+Min31){ CO1=Min11} Else { CO1=Min22+Min31} | If (Min22<Min11+Min31){ CO2=Min22} Else { CO2=Min11+Min31} | If (Min31<Min11+Min22){ CO3=Min31} Else { CO3= Min11+Min22} |
| 0, 1, 1 | If (Min11<Min22+Min32){ CO1=Min11} Else { CO1=Min22+Min32} | If (Min22<Min11+Min32){ CO2=Min22} Else { CO2=Min11+Min32} | If (Min32<Min11+Min22){ CO3=Min32} Else { CO3= Min11+Min22} |
| 1, 0, 0 | If (Min12<Min21+Min31){ CO1=Min11} Else { CO1=Min21+Min31} | If (Min21<Min12+Min31){ CO2=Min21} Else { CO2=Min12+Min31} | If (Min31<Min12+Min21){ CO3=Min31} Else { CO3= Min12+Min21} |
| 1, 0, 1 | If (Min12<Min21+Min32){ CO1=Min11} Else { CO1=Min21+Min32} | If (Min21<Min12+Min32){ CO2=Min21} Else { CO2=Min12+Min32} | If (Min32<Min12+Min21){ CO3=Min32} Else { CO3= Min12+Min21} |
| 1, 1, 0 | If (Min12<Min22+Min31){ CO1=Min11} Else { CO1=Min22+Min31} | If (Min22<Min12+Min31){ CO2=Min22} Else { CO2=Min12+Min31} | If (Min31<Min12+Min22){ CO3=Min31} Else { CO3= Min12+Min22} |
| 1, 1, 1 | If (Min12<Min22+Min32){ CO1=Min11} Else { CO1=Min22+Min32} | If (Min22< Min12+Min32){ CO2=Min22} Else { CO2=Min12+Min32} | If (Min32< Min12+Min22){ CO3=Min32} Else { CO3= Min12+Min22} |

Figure 4:
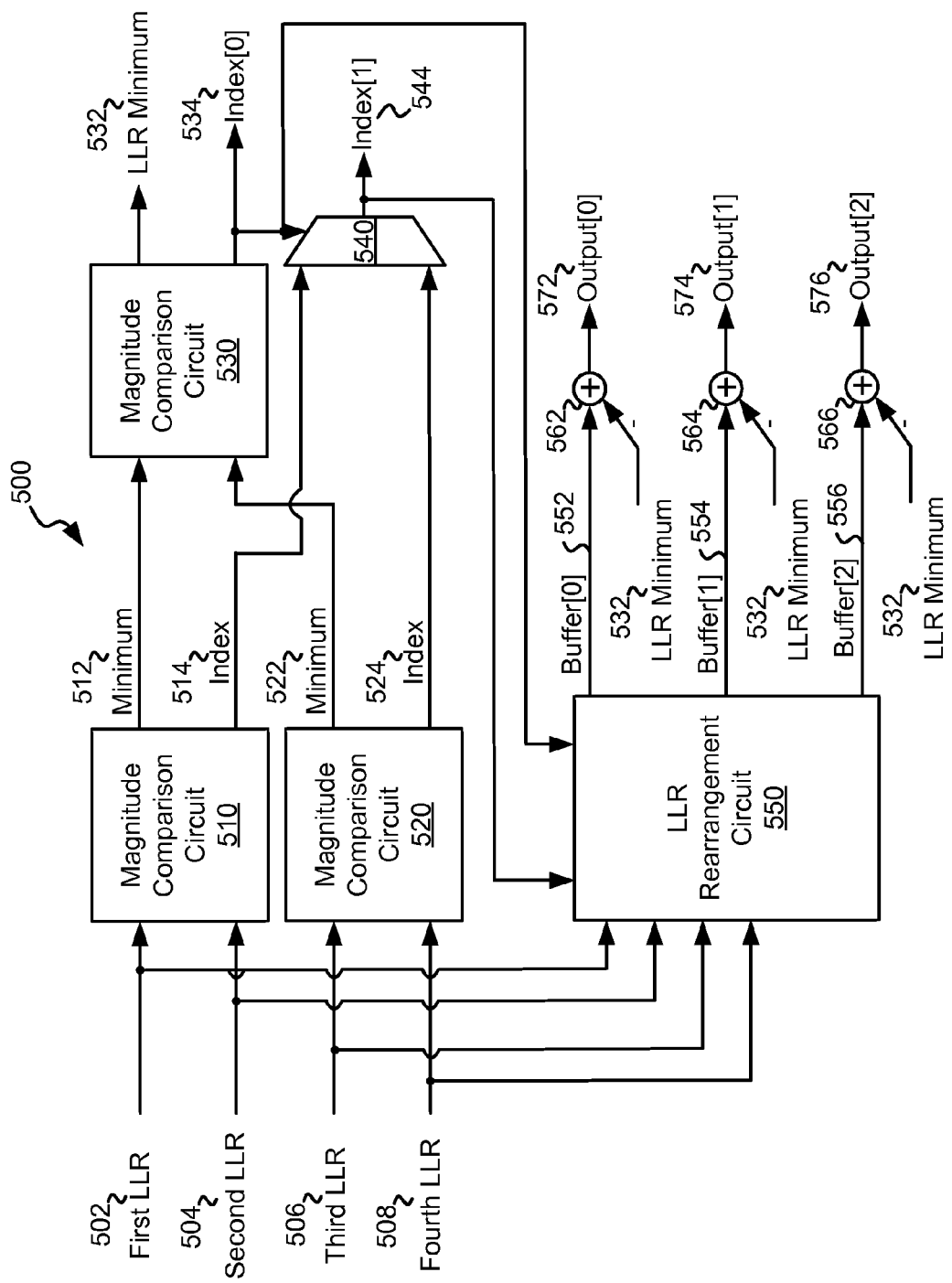
FIG. 4 shows a sorting and normalization circuit that may be used in relation to various embodiments of the present invention.

Turning to FIG. 4, a sorting and normalization circuit 400 is shown that may be used in place of sorting and normalization circuit 270 in accordance with various embodiments of the present invention. Sorting and normalization circuit 400 includes a magnitude comparison circuit 510 that compares a first LLR value 502 (i.e., the LLR value corresponding to hard decision value '00') from a symbol with a second LLR value 504 (i.e., the LLR value corresponding to hard decision value '01') from the same symbol. Magnitude comparison circuit 510 provides the smallest of first LLR value 502 and second LLR value 504 as a minimum 512 and an index 514 indicating the location of minimum 512 within the symbol. A magnitude comparison circuit 520 compares a third LLR value 506 (i.e., the LLR value corresponding to hard decision value '10') from a symbol with a second LLR value 508 (i.e., the LLR value corresponding to hard decision value '11') from the same symbol. Magnitude comparison circuit 520 provides the smallest of third LLR value 506 and second LLR value 508 as a minimum 522 and an index 524 indicating the location of minimum 522 within the symbol. Minimum 512 and minimum 522 are provided to a magnitude comparison circuit 530. Magnitude comparison circuit 530 provide the minimum of minimum 512 and minimum 522 as an LLR minimum 532. In addition, magnitude comparison circuit 530 provides an index[0] 534 that indicates the location of LLR minimum 532 within the symbol. Index[0] 534 is provided as a selector input to a multiplexer circuit 540 that selects either index 514 or index 524 as an index[1] 544.

Index[0] 534 and index[1] 544 are provided to an LLR rearrangement circuit 550. Based upon these input values, LLR rearrangement circuit 550 rearranges the information in the symbol. Such rearrangement may be done in accordance with the following table:

|  | HD | | | |
| --- | --- | --- | --- | --- |
|  | '00' | '01' | '10' | '11' |
| Buffer[0] 552 | second LLR value 504 | first LLR value 502 | third LLR value 506 | fourth LLR value 506 |
| Buffer[1] 554 | third LLR value 506 | fourth LLR value 506 | first LLR value 502 | second LLR value 504 |
| Buffer[2] 556 | fourth LLR value 506 | third LLR value 506 | second LLR value 504 | first LLR value 502 |

LLR minimum 532 is subtracted from: Buffer[0] 552 using a summation circuit 562 to yield an output 572, Buffer[1] 554 using a summation circuit 564 to yield an output 574, and Buffer[2] 556 using a summation circuit 566 to yield an output 576.

Figure 5:
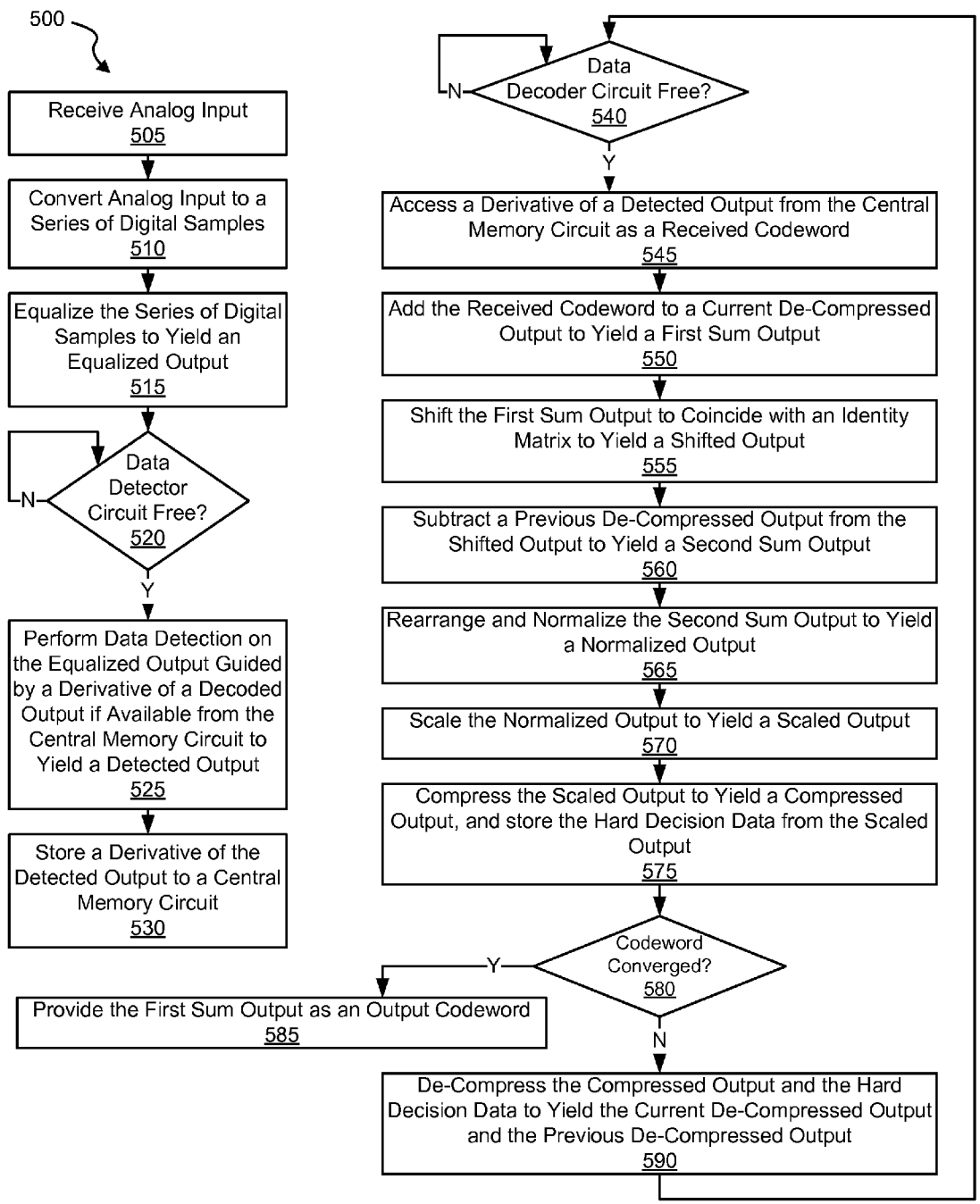
FIG. 5 is a flow diagram showing a method in accordance with one or more embodiments of the present invention for data processing including compression based data decoding.

Turning to FIG. 5, a flow diagram 500 shows a method in accordance with one or more embodiments of the present invention for data processing including compression based data decoding. Flow diagram shows the method of decoding that may be performed by a circuit such as those described herein in relation to FIG. 2. Following flow diagram 500, an analog input is received (block 505). The analog input may be derived from, for example, a storage medium or a data transmission channel. Based upon the disclosure provided herein, one of ordinary skill in the art will recognize a variety of sources of the analog input. The analog input is converted to a series of digital samples (block 510). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 515). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 520). Where a data detector circuit is available (block 520), a data detection algorithm is applied to the equalized output guided by a data set derived from a decoded output where available (e.g., the second and later iterations through the data detector circuit and the data decoder circuit) from a central memory circuit to yield a detected output (block 525). In some embodiments of the present invention, data detection algorithm is a Viterbi algorithm as are known in the art. In other embodiments of the present invention, the data detection algorithm is a maximum a posteriori data detector circuit as are known in the art. A signal derived from the detected output (e.g., a locally interleaved version of the detected output) is stored to the central memory to await processing by a data decoder circuit (block 530).

In parallel to the previously discussed data detection processing, it is determined whether a data decoder circuit is available (block 540). Where the data decoder circuit is available (block 540) a previously stored derivative of a detected output is accessed from the central memory and used as a received codeword (block 545). The received codeword is added to a current de-compressed output to yield a first sum output (block 550). The first sum output is then shifted to coincide with an identity matrix to yield a shifted output (block 555). A previous de-compressed output is subtracted from the shifted output to yield a second sum output (block 560). The second cum output is then rearranged and normalized to yield a normalized output (block 565), and the normalized output is multiplied by a scaling factor to yield a scaled output (block 570).

The scaled output is then compressed to yield a compressed output, and the hard decision data from the scaled output is stored along with the compressed output (block 575). The aforementioned compression includes identifying the first minimum LLR data value (i.e., the lowest LLR value) across an entire row of the code structure matrix, and the second minimum LLR data value (i.e., the second lowest LLR value). In addition, the index value (i.e., the location in the row corresponding to the first minimum LLR data value) is stored. As the code structure matrix has three rows, three sets of first minimum LLR data value, second minimum LLR data value, index value as shown in the example below:

| Row 1 | First Minimum LLR Value |
| --- | --- |
|  | Second Minimum LLR Value |
|  | Index Value |
| Row 2 | First Minimum LLR Value |
|  | Second Minimum LLR Value |
|  | Index Value |
| Row 3 | First Minimum LLR Value |
|  | Second Minimum LLR Value |
|  | Index Value |

This compressed form of the data corresponding to the code structure matrix is stored in a buffer. Two sets of the compressed data and hard decision data are maintained: a current set and a previous set. The current set is based upon the most recent scaled output, and the previous set is based upon the previous scaled output. The hard decision data corresponding to the highest LLR value for each symbol is also stored. Thus, using the following vector for a symbol of the scaled output:

|  | Hard Decision | | | |
|---|---|---|---|---|
|  | 00 | 01 | 10 | 11 |
| Normalized LLR Data Value | −6 | −4 | 0 | −8 |

The hard decision data stored for the particular symbol is '10'.

It is determined whether the data decoding converged (i.e., yielded the originally written data set) (block 580). Where the data decoding converged (block 580), the first sum output is provided as a data output (block 585). Where the original encoding assured that the last data processed was at a known alignment, then providing the data output does not include another shift operation. Alternatively, where the original encoding is not controlled, then providing the data output includes another shift operation to align the output with the identity matrix.

Alternatively, where the data decoding failed to converge (block 580), the combination of the compressed output and the hard decision data are de-compressed to yield the updated decompressed output and the outdated de-compressed output (block 590). The decompression process operates to regenerate an approximation for each row of the code structure using the set of compressed data and hard decision data. In particular, the index value (CI) for the currently received set of data is compared with the index values corresponding to the first minimum LLR data value for row one (index1), the first minimum LLR data value for row two (index2), and the first minimum LLR data value for row three (index3) to yield the comparison values: comparison row 1 (CR1), comparison row 2 (CR2) and comparison row 3 (CR3) in accordance with the following pseudocode:

```
If (CI == index1)
{
    CR1 = 1
}
Else
{
    CR1=0
}
If (CI == index2)
{
    CR2 = 1
}
Else
{
    CR2=0
}
If (CI == index3)
{
    CR3 = 1
}
Else
{
    CR3=0
}
```

These index values are then used to determine the values of first row de-compressed output 342 (CO1), second row de-compressed output 344 (CO2), and third row de-compressed output 346 (CO3) in accordance with the following table:

| CR1, CR2, CR3 | CO1 | CO2 | CO3 |
|---|---|---|---|
| 0, 0, 0 | If (Min11<Min21+Min31){ CO1=Min11} Else { CO1=Min21+Min31} | If (Min21<Min11+Min31){ CO2=Min21} Else { CO2=Min11+Min31} | If (Min31<Min11+Min21){ CO3=Min31} Else { CO3=Min11+Min21} |
| 0, 0, 1 | If (Min11<Min21+Min32){ CO1=Min11} Else { CO1=Min21+Min32} | If (Min21<Min11+Min32){ CO2=Min21} Else { CO2=Min11+Min32} | If (Min32<Min11+Min21){ CO3=Min32} Else { CO3=Min11+Min21} |
| 0, 1, 0 | If (Min11<Min22+Min31){ CO1=Min11} Else { CO1=Min22+Min31} | If (Min22<Min11+Min31){ CO2=Min22} Else { CO2=Min11+Min31} | If (Min31<Min11+Min22){ CO3=Min31} Else { CO3= Min11+Min22} |
| 0, 1, 1 | If (Min11<Min22+Min32){ CO1=Min11} Else { CO1=Min22+Min32} | If (Min22<Min11+Min32){ CO2=Min22} Else { CO2=Min11+Min32} | If (Min32<Min11+Min22){ CO3=Min32} Else { CO3= Min11+Min22} |
| 1, 0, 0 | If (Min12<Min21+Min31){ CO1=Min11} Else { CO1=Min21+Min31} | If (Min21<Min12+Min31){ CO2=Min21} Else { CO2=Min12+Min31} | If (Min31<Min12+Min21){ CO3=Min31} Else { CO3= Min12+Min21} |
| 1, 0, 1 | If (Min12<Min21+Min32){ CO1=Min11} Else { CO1=Min21+Min32} | If (Min21<Min12+Min32){ CO2=Min21} Else { CO2=Min12+Min32} | If (Min32<Min12+Min21){ CO3=Min32} Else { CO3= Min12+Min21} |
| 1, 1, 0 | If (Min12<Min22+Min31){ CO1=Min11} Else { CO1=Min22+Min31} | If (Min22<Min12+Min31){ CO2=Min22} Else { CO2=Min12+Min31} | If (Min31<Min12+Min22){ CO3=Min31} Else { CO3= Min12+Min22} |
| 1, 1, 1 | If (Min12<Min22+Min32){ CO1=Min11} Else { CO1=Min22+Min32} | If (Min22< Min12+Min32){ CO2=Min22} Else { CO2=Min12+Min32} | If (Min32< Min12+Min22){ CO3=Min32} Else { CO3= Min12+Min22} |

Figure 6:
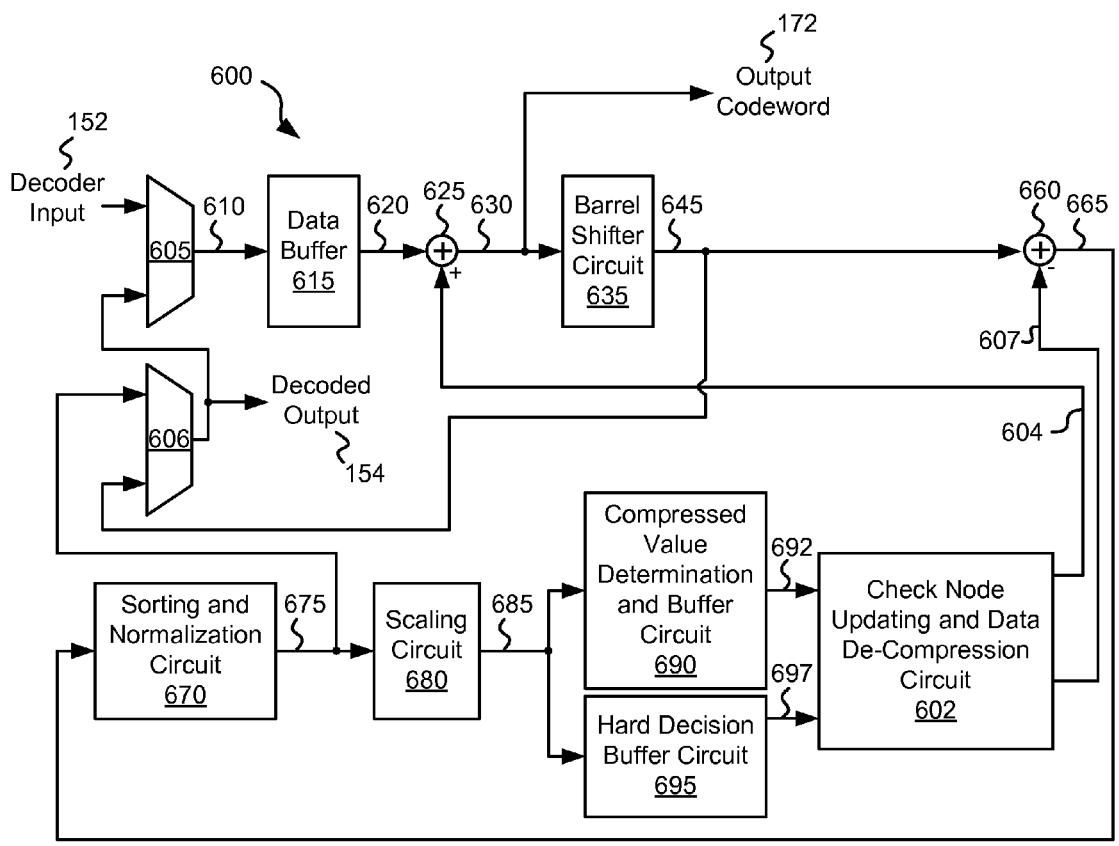
FIG. 6 shows another compression based decoding circuit in accordance with other embodiments of the present invention.

Turning to FIG. 6, another compression based decoding circuit 600 is shown in accordance with various embodiments of the present invention. Compression based decoding circuit 200 may be used in place of compression based decoding circuit 170 of FIG. 1 where the upstream encoder assures that the last row of the code structure is formed of the identity matrix. This allows for the elimination of one of the barrel shifter circuits discussed above in relation to FIG. 2. Compression based decoding circuit 600 includes a multiplexer 605 that receives decoder input 152. Decoder input 152 is an uncompressed data set. Multiplexer 605 selects between decoder input 152 and decoded output 154 (another uncompressed data set) to be provided as a data input 610. Data input 610 is stored to a data buffer 615. In operation, decoder input 152 is selected as data input 610 before the first local iteration through the data decoder circuit. For later iterations, decoded output 154 is selected by multiplexer 605 as data input 610. As data input 610 is either decoder input 152 and decoded output 154, data input 610 is also uncompressed. Data buffer 615 provides a buffered output 620 to a summation circuit 625.

Summation circuit 625 adds a current de-compressed decoded output 604 to buffered output 620 to yield a summed output 630. Summed output is an uncompressed data set. Summed output 630 is provided to a barrel shifter circuit 635. When decoding converges, summed output 630 is provided as output codeword 172 that is an uncompressed output. Barrel shifter circuit 635 is a shift register that is operable to shift summed output 630 so that it aligns with a previous de-compressed decoded output 607. Barrel shifter 635 provides the aligned output as a shifted output 645 to a summation circuit 660 that is operable to subtract previous decompressed decoded output 607 from shifted output 645 to yield a summed output 665. Summed output 665 is an uncompressed output.

Summed output 665 is provided to a sorting and normalization circuit 670 that sorts elements of summed output 665 and normalizes summed output 665 to yield a decoded output 675. Decoded output 675 is uncompressed. Decoded output 675 and shifted output 645 are provided to a multiplexer circuit 606. Multiplexer circuit 606 selects one of decoded output 675 or shifted output 645 as decoded output 154.

Decoded output 675 is provided to a scaling circuit 680 that is operable to scale decoded output 675 to yield a scaled, decoded output 685. Scaled, decoded output 685 is provided to a compressed value determination circuit 690 and a hard decision buffer circuit 695. Compressed value determination circuit 690 is operable to compress the received data and to buffer the compressed data. Such compression substantially reduces the size of the buffer required to store the data in preparation for subsequent iterations through the data decoder circuit. Hard decision buffer circuit 695 preserves the most likely hard decision for each symbol of scaled, decoded output 685 for use in subsequent decompression. Compressed value determination circuit 690 provides a compressed output 692 to a check node updating and data de-compression circuit 602, and sign data buffer circuit 695 provides a hard decision output 697 to check node updating and data de-compression circuit 602. Check node updating and data de-compression circuit 602 performs a check node process and decompresses the result to yield current de-compressed decoded output 604 and previous de-compressed decoded output 607.

In one particular embodiment of the present invention, compression based decoding circuit 600 is a two bit, non-binary decoder circuit where each symbol in decoder input 152 is a two bit symbol representing four possible hard decision values (i.e., '00', '01', '10' and '11'). In such an embodiment, decoder input 152, decoded output 154 and output codeword 172 are vectors of log likelihood ratio (LLR) data corresponding to probabilities that respective ones of the four hard decision values are correct. Summation circuit 625 and summation circuit 660 in such an embodiment are vector summation circuits operable to sum corresponding elements of two vectors to yield a single vector output. Summation circuit 625 receives buffered output 620 that includes a vector of LLR data corresponding to the respective hard decision values of a series of symbols, and adds current de-compressed decoded output 604 that also includes a vector of LLR data corresponding to the respective hard decision values of a series of symbols to yield summed output 630. As is expected, summed output 630 also includes a vector of LLR data corresponding to the respective hard decision values of a series of symbols.

The code structure of the codeword provided as decoder input 152 has a code structure matrix of the following form:

$$\begin{bmatrix} P_{1,1} & P_{1,2} & \ldots & P_{1,J} & \ldots & P_{1,L} \\ P_{2,1} & P_{2,2} & \ldots & P_{2,J} & \ldots & P_{2,L} \\ P_{3,1} & P_{3,2} & \ldots & P_{3,J} & \ldots & P_{3,L} \end{bmatrix}$$

where each of $P_{I,J}$ are pxp circulants with weight 1, and the circulant size L is the row weight. The following is an example of a pxp circulant representative of $P_{I,J}$:

$$P_{I,J} = \begin{bmatrix} 0 & \alpha & 0 & \ldots & 0 \\ 0 & 0 & \alpha & \ldots & 0 \\ \vdots & \vdots & \vdots & \ddots & \vdots \\ 0 & 0 & 0 & \ldots & \alpha \\ \alpha & 0 & 0 & \ldots & 0 \end{bmatrix}$$

In such a two-bit, non-binary decoder circuit, barrel shifter circuit 635 is operable to shift the currently received circulant to an identity matrix. Such an identity matrix may be as follows:

$$P_{I,J} = \begin{bmatrix} \alpha & 0 & 0 & \ldots & 0 \\ 0 & \alpha & 0 & \ldots & 0 \\ \vdots & \vdots & \vdots & \ddots & \vdots \\ 0 & 0 & \alpha & \ldots & 0 \\ 0 & 0 & 0 & \ldots & \alpha \end{bmatrix}$$

Barrel shifter circuit 635 provides shifted output 645 to summation circuit 660. Summation circuit 660 receives shifted output 645 that includes a vector of LLR data corresponding to the respective hard decision values of a series of symbols, and subtracts previous decompressed decoded output 607 that also includes a vector of LLR data corresponding to the respective hard decision values of a series of symbols to yield summed output 665. As is expected, summed output 665 also includes a vector of LLR data corresponding to the respective hard decision values of a series of symbols.

Summed output 665 is provided to sorting and normalization circuit 670. Sorting and normalization circuit 670 takes the four LLR data values from each symbol received as summed output 665, identifies the highest LLR data value of the four values, and normalizes the four LLR data values to the value of the highest LLR data value. An example of the operation of sorting and normalization circuit 670 is shown using the following example symbol:

|  | Hard Decision | | | |
|---|---|---|---|---|
|  | 00 | 01 | 10 | 11 |
| LLR Data Value | 10 | 15 | 22 | 6 |

In this example, sorting and normalization circuit 670 selects the LLR data value '22' corresponding to the hard decision '10'. Next, the LLR data values corresponding to hard decision values '00', '01', '10' and '11' are normalized to LLR data value '22' by subtracting '22' from each of the LLR data values to yield the following normalized symbol:

|  | Hard Decision | | | |
|---|---|---|---|---|
|  | 00 | 01 | 10 | 11 |
| Normalized LLR Data Value | −12 | −7 | 0 | −16 |

Each of the normalized symbol values are provided as decoded output 675 to scaling circuit 680. Scaling circuit 680 multiplies each of the normalized LLR data values by a scaling factor to yield scaled, decoded output 685. The scaling factor may be user programmable. As an example, the scaling factor is 0.5. Where the scaling factor is 0.5, the following scaled symbol is used:

|  | Hard Decision | | | |
|---|---|---|---|---|
|  | 00 | 01 | 10 | 11 |
| Normalized LLR Data Value | −6 | −4 | 0 | −8 |

Scaled, decoded output 685 is provided to compressed value determination and buffer circuit. Compressed value determination and buffer circuit 690 is operable to identify the first minimum LLR data value (i.e., the lowest LLR value) across an entire row of the code structure matrix, and the second minimum LLR data value (i.e., the second lowest LLR value). In addition, compressed value determination and buffer circuit 690 stores the index value (i.e., the location in the row corresponding to the first minimum LLR data value). As the code structure matrix has three rows, compressed value determination and buffer circuit 690 stores three sets of first minimum LLR data value, second minimum LLR data value, index value as shown in the example below:

| Row 1 | First Minimum LLR Value |
|---|---|
|  | Second Minimum LLR Value |
|  | Index Value |
| Row 2 | First Minimum LLR Value |
|  | Second Minimum LLR Value |
|  | Index Value |
| Row 3 | First Minimum LLR Value |
|  | Second Minimum LLR Value |
|  | Index Value |

This compressed form of the data corresponding to the code structure matrix is stored in a buffer that is part of compressed value determination and buffer circuit 690. Compressed value determination and buffer circuit 690 stores two sets of data: a current set and a previous set. The current set is based upon the most recent scaled, decoded output 685, and the previous set is based upon the previous scaled, decoded output 685.

Scaled, decoded output 685 is also provided to hard decision buffer circuit 695. Hard decision buffer circuit 695 stores the hard decision value for each symbol in a given row corresponding to the highest LLR value. Thus, using the following vector for a symbol of scaled, decoded output 685:

|  | Hard Decision | | | |
|---|---|---|---|---|
|  | 00 | 01 | 10 | 11 |
| Normalized LLR Data Value | −6 | −4 | 0 | −8 | hard decision buffer circuit 695 stores the hard decision value '10'. Hard decision buffer circuit 695 stores two sets of data: a current set and a previous set. The current set is based upon the most recent scaled, decoded output 685, and the previous set is based upon the previous scaled, decoded output 685.

Both the current set and previous set of stored hard decision values from hard decision buffer circuit 695 are provided as a hard decision output 697 to check node updating and data de-compression circuit 602, and both the current set and previous set of data from compressed value determination and buffer circuit 690 are provided as compressed output 692 to check node updating and data de-compression circuit 602. Check node updating and data decompression circuit 602 reassembles rows to yield an approximation of the original data. In particular, a current approximation of the original data is provided as current de-compressed decoded output 604, and previous de-compressed decoded output 607.

Figure 7:
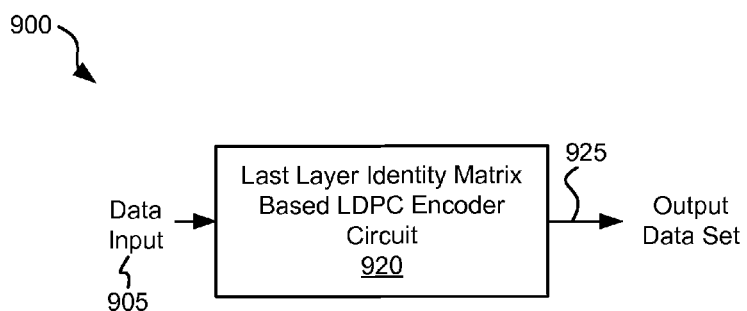
FIG. 7 shows a data encoder circuit providing identity matrix based encoding in accordance with some embodiments of the present invention.

Turning to FIG. 7, a data encoder circuit 900 providing identity matrix based encoding is shown in accordance with some embodiments of the present invention. Data encoder circuit 900 includes a last layer identity matrix based encoder circuit 920. In some embodiments of the present invention, last layer identity matrix based encoder circuit 920 is operable to apply a low density parity check encoding algorithm to a data input 905 to yield an output data set 925. Of note, last layer identity matrix based encoder circuit 920 is designed such that the last row of the code structure of output data set 925 is comprised of circulants that correspond to an identity matrix. An example of such an identity matrix is shown below:

$$P_{I,J} = \begin{bmatrix} \alpha & 0 & 0 & \cdots & 0 \\ 0 & \alpha & 0 & \cdots & 0 \\ \vdots & \vdots & \vdots & \ddots & \vdots \\ 0 & 0 & \alpha & \cdots & 0 \\ 0 & 0 & 0 & \cdots & \alpha \end{bmatrix}$$

By assuring that the last row of the code structure of output data set 925 is formed of the identity matrix, barrel shifter circuit 240 of compression based decoding circuit 200 of FIG. 2 may be eliminated. Thus, compression based decoding circuit 200 of FIG. 2 may be replaced by the power and area reduced compression based decoding circuit 600 of FIG. 6.

Figure 8:
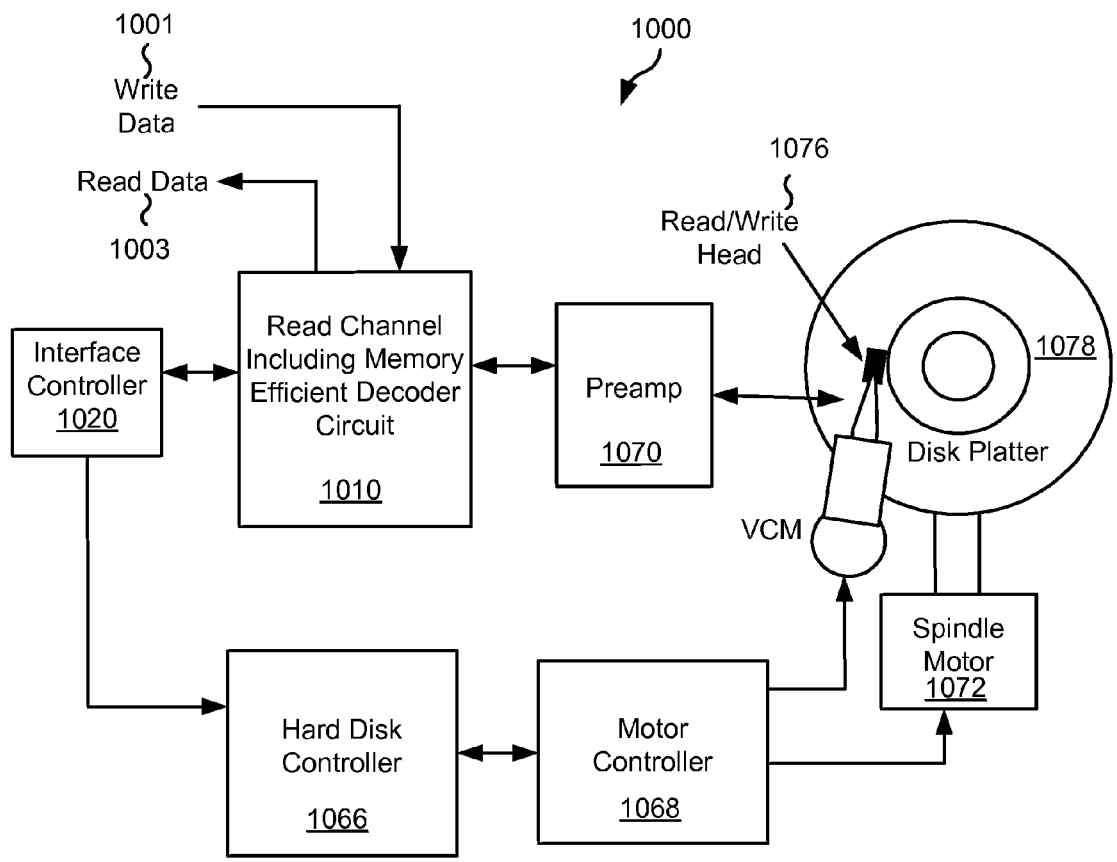
FIG. 8 depicts a data processing circuit having a memory efficient decoder circuit in accordance with some embodiments of the present invention.
Figure 9:
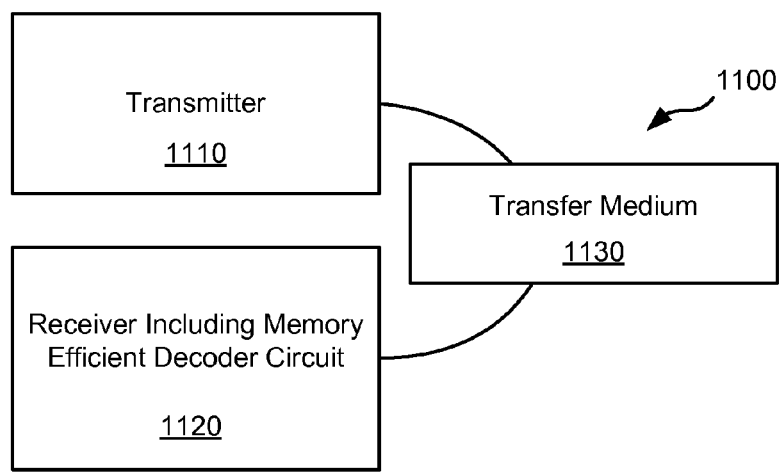
FIG. 9 shows a data transmission system including a memory efficient decoder circuit in accordance with some embodiments of the present invention.

Turning to FIG. 8, a storage system 1000 including a read channel circuit 1010 having a memory efficient decoder circuit is shown in accordance with one or more embodiments of the present invention. Storage system 800 may be, for example, a hard disk drive. Storage system 1000 also includes a preamplifier 1070, an interface controller 1020, a hard disk controller 1066, a motor controller 1068, a spindle motor 1072, a disk platter 1078, and a read/write head assembly 1076. Interface controller 1020 controls addressing and timing of data to/from disk platter 1078. The data on disk platter 1078 consists of groups of magnetic signals that may be detected by read/write head assembly 1076 when the assembly is properly positioned over disk platter 1078. In one embodiment, disk platter 1078 includes magnetic signals recorded in accordance with either a longitudinal or a perpendicular recording scheme.

In a typical read operation, read/write head assembly 1076 is accurately positioned by motor controller 1068 over a desired data track on disk platter 1078. Motor controller 1068 both positions read/write head assembly 1076 in relation to disk platter 1078 and drives spindle motor 1072 by moving read/write head assembly to the proper data track on disk platter 1078 under the direction of hard disk controller 1066. Spindle motor 1072 spins disk platter 1078 at a determined spin rate (RPMs). Once read/write head assembly 1078 is positioned adjacent the proper data track, magnetic signals representing data on disk platter 1078 are sensed by read/write head assembly 1076 as disk platter 1078 is rotated by spindle motor 1072. The sensed magnetic signals are provided as a continuous, minute analog signal representative of the magnetic data on disk platter 1078. This minute analog signal is transferred from read/write head assembly 1076 to read channel circuit 1010 via preamplifier 1070. Preamplifier 1070 is operable to amplify the minute analog signals accessed from disk platter 1078. In turn, read channel circuit 1010 decodes and digitizes the received analog signal to recreate the information originally written to disk platter 1078. This data is provided as read data 1003 to a receiving circuit. A write operation is substantially the opposite of the preceding read operation with write data 1001 being provided to read channel circuit 1010. This data is then encoded and written to disk platter 1078. The memory efficient decoder circuit included as part of read channel circuit 1010 may be implemented similar to that described above in relation to FIG. 2 or FIG. 6, and/or may operate consistent with the method described above in relation to FIG. 5.

It should be noted that storage system may utilize SATA, SAS or other storage technologies known in the art. Also, it should be noted that storage system 1000 may be integrated into a larger storage system such as, for example, a RAID (redundant array of inexpensive disks or redundant array of independent disks) based storage system. It should also be noted that various functions or blocks of storage system 1000 may be implemented in either software or firmware, while other functions or blocks are implemented in hardware.

Turning to FIG. 11, a data transmission system 1100 including a receiver 1120 having a memory efficient decoder circuit is shown in accordance with some embodiments of the present invention. Data transmission system 1100 includes a transmitter 1110 that is operable to transmit encoded information via a transfer medium 1130 as is known in the art. The encoded data is received from transfer medium 1130 by receiver 1120. Receiver 1120 incorporates sub-codeword decoding and encoding circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 1130 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention. Data may be encoded by receiver 1120 for transmission to another receiver circuit (not shown). The memory efficient decoder circuit included as part of receiver 1120 may be implemented similar to that described above in relation to FIG. 2 or FIG. 6, and/or may operate consistent with the method described above in relation to FIG. 5.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
 a data encoder circuit operable to apply an encoding algorithm to an input data set in accordance with a multi-layer code structure including a first row and a last row to yield an encoded data set, wherein the last row of the multi-layer code structure represented in the encoded data set conforms to an identity matrix.

2. The data processing system of claim 1, wherein the data processing system further comprises:
 a data processing circuit operable to decode the encoded data set to yield the input data set.

3. The data processing system of claim 2, wherein the data processing circuit includes:
 a data detector circuit operable to apply a data detection algorithm to the encoded data set to yield a detected output; and
 a data decoder circuit operable to apply a data decode algorithm to a decoder input derived form the detected output to yield a decoded output.

4. The data processing system of claim 3, wherein the data detection algorithm is selected from a group consisting of: a maximum a posteriori data detection algorithm and a Viterbi detection algorithm.

5. The data processing system of claim 3, wherein the data decoder circuit is operable to:

add a second decoded output from the decoder input to yield a first summed output;

shift the summed output to conform with the identity matrix to yield a shifted output; and subtract a third decoded output from the shifted output to yield a second summed output.

6. The data processing circuit of claim 5, wherein both the second decoded output and the third decoded output are generated based upon the decoder input, wherein the second decoded output is generated on a first application of the data decode algorithm and the third decoded output is generated on a second application of the data decode algorithm, and wherein the first application of the data decode algorithm precedes the second application of the data decode algorithm.

7. The data processing circuit of claim 5, wherein the first summed output is provided unshifted as an output codeword.

8. The data processing circuit of claim 7, wherein the first summed output conforms with the identity matrix prior to shifting.

9. The data processing system of claim 1, wherein the data processing system is implemented as part of a device selected from a group consisting of: a storage device, and a transceiver device.

10. The data processing system of claim 1, wherein at least a portion of the data processing system is implemented as part of an integrated circuit.

11. The data processing system of claim 1, wherein the encoding algorithm is a low density parity check algorithm.

12. The data processing system of claim 11, wherein the low density parity check algorithm is selected from a group consisting of: a non-binary low density parity check algorithm, and a binary low density parity check algorithm.

13. A method for data processing, the method comprising:

applying an encoding algorithm by a data encoder circuit to an input data set in accordance with a multi-layer code structure including a first row and a last row to yield an encoded data set, wherein the last row of the multi-layer code structure represented in the encoded data set conforms to an identity matrix.

14. The method of claim 13, wherein the encoding algorithm is a low density parity check algorithm, and wherein the low density parity check algorithm is selected from a group consisting of: a non-binary low density parity check algorithm, and a binary low density parity check algorithm.

15. The method of claim 13, wherein the method further comprises:

applying a data detection algorithm to the encoded data set to yield a detected output; and applying a data decode algorithm to a decoder input derived form the detected output to yield a decoded output.

16. The method of claim 15, wherein applying the data decode algorithm comprises:

adding a second decoded output from the decoder input to yield a first summed output;

shifting the summed output to conform with the identity matrix to yield a shifted output; and subtracting a third decoded output from the shifted output to yield a second summed output.

17. The method of claim 16, wherein both the second decoded output and the third decoded output are generated based upon the decoder input, wherein the second decoded output is generated on a first application of the data decode algorithm and the third decoded output is generated on a second application of the data decode algorithm, and wherein the first application of the data decode algorithm precedes the second application of the data decode algorithm.

18. The method of claim 16, wherein the method further comprises:

determining that the first decoded output converged; and providing the first summed output unshifted as an output codeword, wherein the first summed output unshifted conforms with the identity matrix.

19. A storage device, the storage device comprising:

a data encoder circuit operable to apply an encoding algorithm to an input data set in accordance with a multi-layer code structure including a first row and a last row to yield an encoded data set, wherein the last row of the multi-layer code structure represented in the encoded data set conforms to an identity matrix;

a storage medium operable receive a data set corresponding to the encoded data set;

a head assembly disposed in relation to the storage medium and operable to provide a sensed signal corresponding to the encoded data set;

a read channel circuit including:

an analog to digital converter circuit operable to sample an analog signal derived from the sensed signal to yield a series of digital samples;

an equalizer circuit operable to equalize the digital samples to yield detector data set corresponding to the encoded data set;

a data detector circuit operable to apply a data detection algorithm to the data set to yield a detected output;

a data decoder circuit operable to:

add a second decoded output from the decoder input to yield a first summed output;

shift the summed output to conform with the identity matrix to yield a shifted output;

subtract a third decoded output from the shifted output to yield a second summed output; and wherein the first summed output is provided unshifted as an output codeword.

20. The storage device of claim 19, wherein the encoding algorithm is a low density parity check algorithm, and wherein the low density parity check algorithm is selected from a group consisting of: a non-binary low density parity check algorithm, and a binary low density parity check algorithm.

* * * * *